(12) United States Patent
Rokitski et al.

(10) Patent No.: US 9,207,119 B2
(45) Date of Patent: Dec. 8, 2015

(54) ACTIVE SPECTRAL CONTROL DURING SPECTRUM SYNTHESIS

(71) Applicant: Cymer, LLC, San Diego, CA (US)

(72) Inventors: Rostislav Rokitski, La Jolla, CA (US); Nakgeuon Seong, San Diego, CA (US); Kevin O'Brien, San Diego, CA (US)

(73) Assignee: Cymer, LLC, San Diego, CA (US)

( * ) Notice: Subject to any disclaimer, the term of this patent is extended or adjusted under 35 U.S.C. 154(b) by 61 days.

(21) Appl. No.: 13/830,466

(22) Filed: Mar. 14, 2013

(65) Prior Publication Data

US 2014/0104614 A1    Apr. 17, 2014

Related U.S. Application Data

(60) Provisional application No. 61/639,356, filed on Apr. 27, 2012.

(51) Int. Cl.
*G01J 3/46* (2006.01)
*G01J 3/28* (2006.01)
(Continued)

(52) U.S. Cl.
CPC .. *G01J 3/28* (2013.01); *G01J 3/027* (2013.01); *G01J 3/1809* (2013.01); *G01J 11/00* (2013.01); *G03F 7/7085* (2013.01); *G03F 7/70091* (2013.01); *G03F 7/70575* (2013.01); *G01J 2001/4238* (2013.01); *G01J 2009/006* (2013.01)

(58) Field of Classification Search
CPC ......... G01J 11/00; G01J 3/027; G01J 3/1089; G01J 3/28; G03F 7/2006; G03F 7/70041; G03F 7/70091; G03F 7/70575; G03F 7/70025
USPC ..................... 356/236, 327, 451, 402; 702/23
See application file for complete search history.

(56) References Cited

U.S. PATENT DOCUMENTS 5,218,553 A * 6/1993 de Loos-Vollebregt et al. ............................... 702/23
5,473,162 A * 12/1995 Busch et al. ............... 250/341.6
(Continued)

FOREIGN PATENT DOCUMENTS

WO      02093700      11/2002

OTHER PUBLICATIONS

Kevin O'Brien; Rui Jiang; Nora Han; Efrain Figueroa; Raj Rao, et al. "High-range laser light bandwidth measurement and tuning", Proc. SPIE 7973, Optical Microlithography XXIV, 797326 (Mar. 22, 2011), 9 pages.

(Continued)

*Primary Examiner* — Kara E Geisel
*Assistant Examiner* — Dominic J Bologna
(74) *Attorney, Agent, or Firm* — DiBerardino McGovern IP Group LLC

(57) ABSTRACT

A spectral feature of a pulsed light beam produced by an optical source is estimated by modifying the wavelength of the pulsed light beam based on a predefined repeating pattern having a pattern period including a plurality of steps, the modification including shifting the wavelength of the pulsed light beam by a wavelength offset from a baseline wavelength for each step in the pattern period; measuring the wavelength of the light beam for each step in the pattern period as the wavelength is modified across the pattern; and estimating a spectral feature of the pulsed light beam over an evaluation window that includes all of the steps within the pattern period based at least in part on the measured wavelength of the light beam for each step in the pattern period.

27 Claims, 11 Drawing Sheets

(51) Int. Cl.
*G03F 7/20* (2006.01)
*G01J 3/18* (2006.01)
*G01J 11/00* (2006.01)
*G01J 3/02* (2006.01)
G01J 1/42 (2006.01)
G01J 9/00 (2006.01)

(56) References Cited

U.S. PATENT DOCUMENTS

| | | | |
|---|---|---|---|
| 5,793,485 A * | 8/1998 | Gourley | 356/318 |
| 6,671,294 B2 | 12/2003 | Kroyan et al. | |
| 6,721,340 B1 * | 4/2004 | Fomenkov et al. | 372/25 |
| 6,853,653 B2 | 2/2005 | Spangler et al. | |
| 6,952,267 B2 | 10/2005 | Rafac | |
| 7,088,758 B2 | 8/2006 | Sandstrom et al. | |
| 7,139,301 B2 | 11/2006 | Kroyan et al. | |
| 7,154,928 B2 | 12/2006 | Sandstrom et al. | |
| 7,298,770 B2 | 11/2007 | Spangler et al. | |
| 7,317,536 B2 | 1/2008 | Rafac | |
| 7,366,219 B2 | 4/2008 | Algots et al. | |
| 7,382,815 B2 | 6/2008 | Spangler et al. | |
| 7,822,084 B2 | 10/2010 | O'Brien et al. | |
| 7,894,494 B2 | 2/2011 | Ishihara | |
| 7,899,095 B2 | 3/2011 | Partlo | |
| 7,903,700 B2 | 3/2011 | Nagai et al. | |
| 8,102,889 B2 | 1/2012 | Jacques et al. | |
| 8,144,739 B2 | 3/2012 | Figueroa et al. | |
| 8,259,764 B2 | 9/2012 | Fomenkov et al. | |
| 2004/0021859 A1 * | 2/2004 | Cunningham | 356/300 |
| 2006/0114956 A1 * | 6/2006 | Sandstrom et al. | 372/55 |
| 2007/0115228 A1 * | 5/2007 | Roberts et al. | 345/82 |
| 2008/0191643 A1 * | 8/2008 | Roberts et al. | 315/300 |

OTHER PUBLICATIONS

ELIAS Spectrometers, by LTB Lasertechnik Berlin GmbH, www.ltb-berlin.de, Mar. 1, 2009, 4 pages.

"Dual-chamber ultra line-narrowed excimer light source for 193 nm lithography," V.B. Fleurov, et al., Optical Microlithography XVI, Anthony Yen, Editor, Proceedings of SPIE vol. 5040 (2003), pp. 1694-1703.

Shane Thomas, US International Searching Authority, International Search Report in Counterpart Application PCT/US13/35337, dated Aug. 6, 2013, 2 pages.

Shane Thomas, US International Searching Authority, Written Opinion of the International Searching Authority in Counterpart Application PCT/US13/35337, dated Aug. 6, 2013, 5 pages.

* cited by examiner

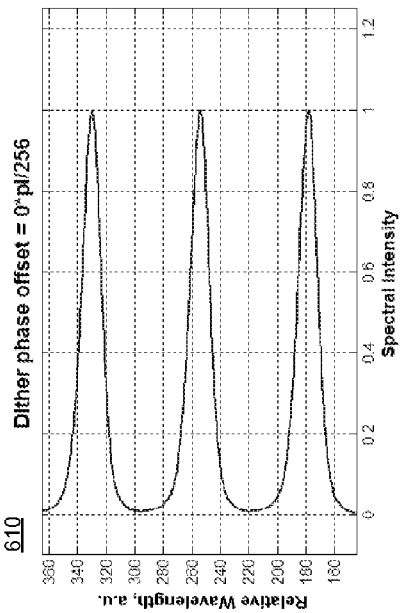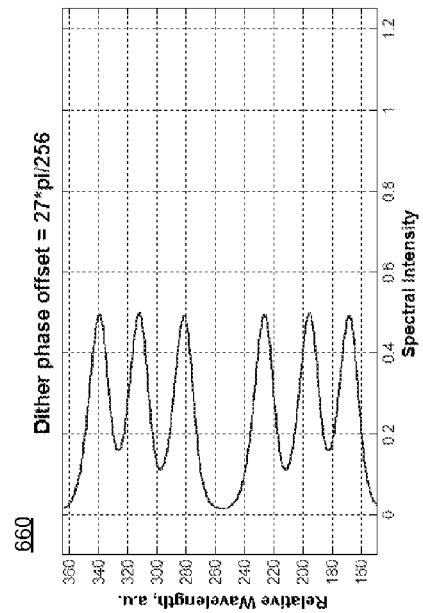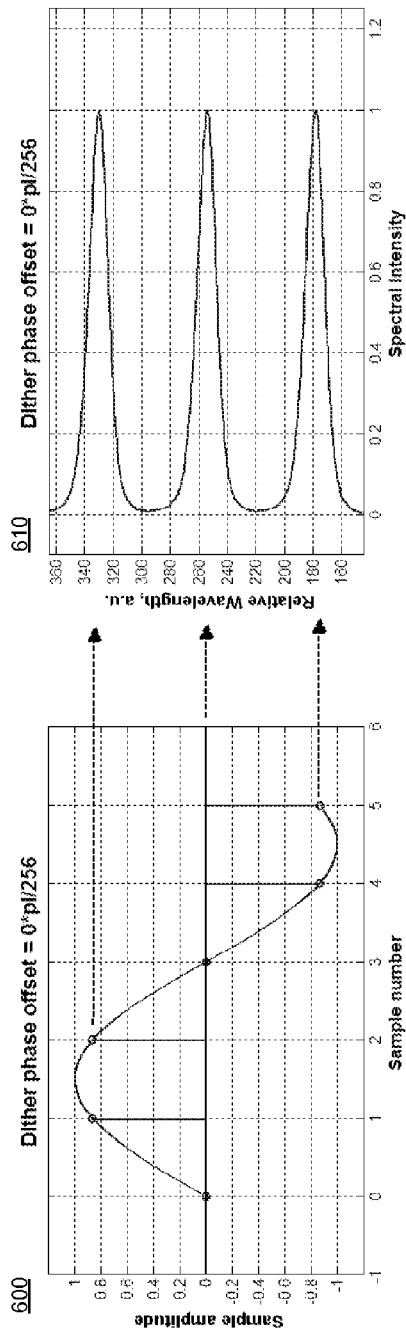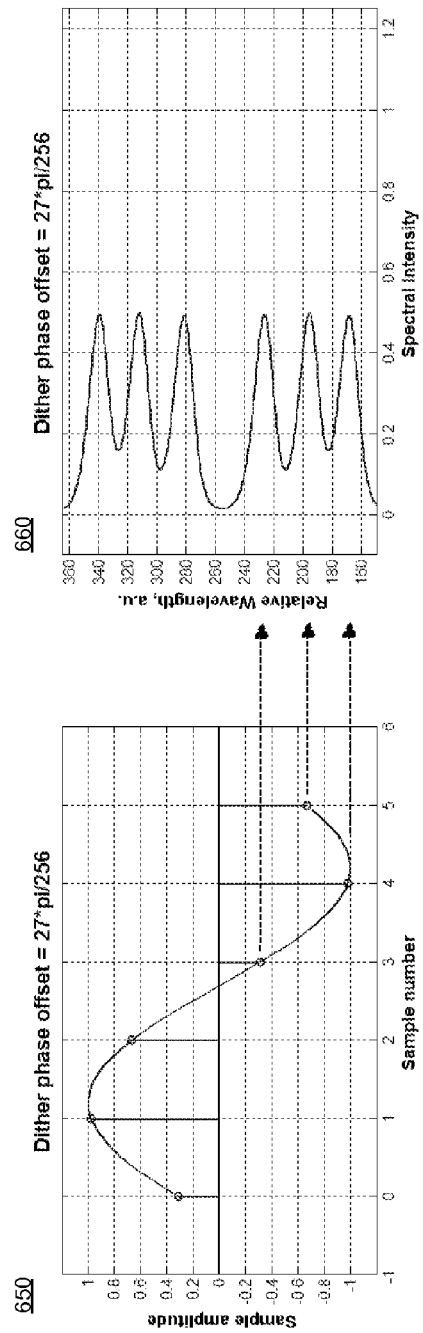

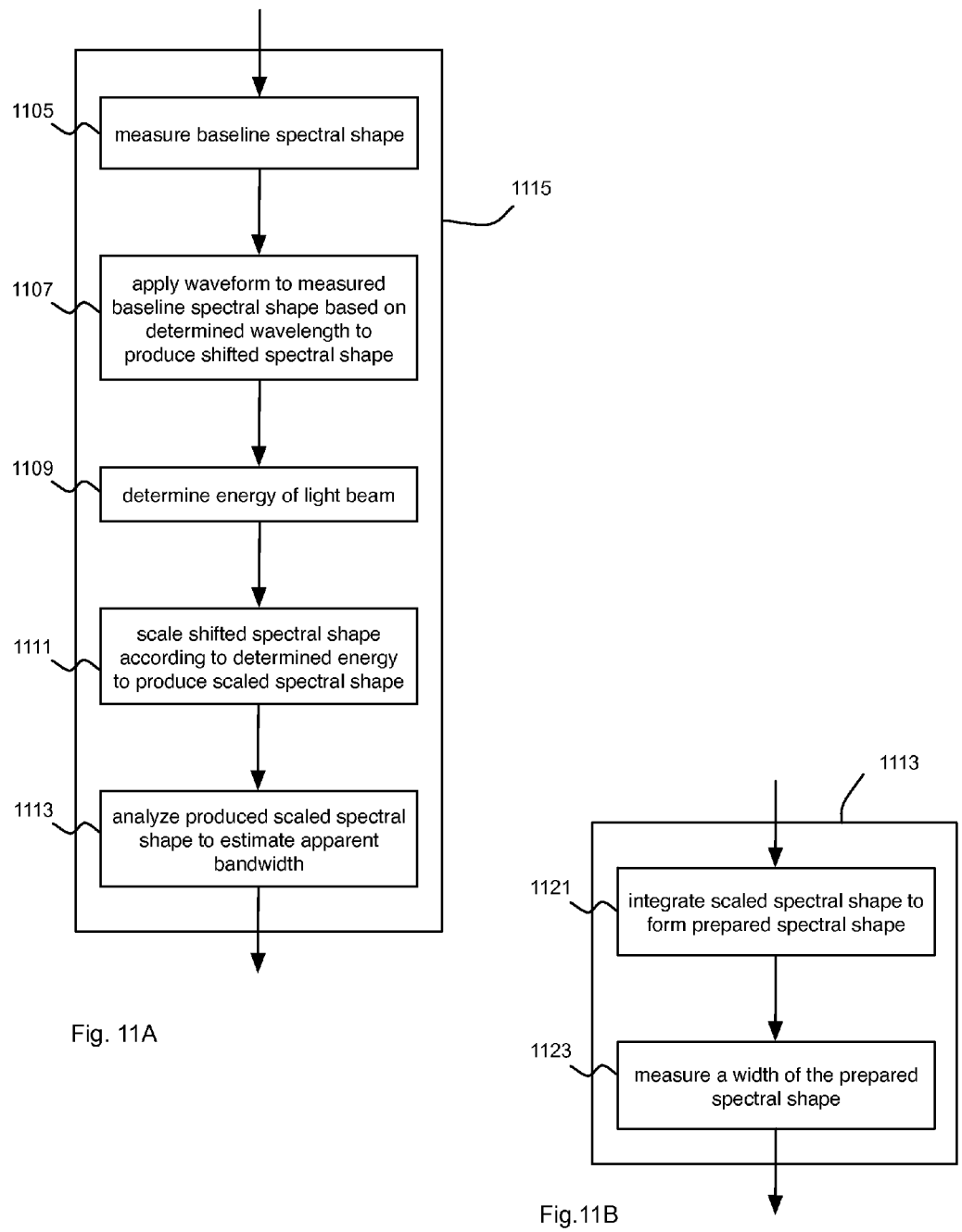

ACTIVE SPECTRAL CONTROL DURING SPECTRUM SYNTHESIS

TECHNICAL FIELD

The disclosed subject matter relates to active spectral control of an optical source that supplies light to a lithography exposure apparatus.

BACKGROUND

An accurate knowledge of spectral properties (for example, a bandwidth) of an optical source such as a laser is important in many scientific and industrial applications. For example, accurate knowledge of the optical source bandwidth is needed to enable control of a minimum feature size or critical dimension (CD) in deep ultraviolet (DUV) optical lithography. The critical dimension is the feature size that needs to be printed on a semiconductor substrate (also referred to as a wafer) and therefore the CD can require tight size control. In optical lithography, the substrate is irradiated by a light beam produced by an optical source. Often, the optical source is a laser source and the light beam is a laser beam.

SUMMARY

In some general aspects, a method is described that estimates a spectral feature of a pulsed light beam produced by an optical source. The method includes modifying the wavelength of the pulsed light beam based on a predefined repeating pattern having a pattern period including a plurality of steps, the modification including shifting the wavelength of the pulsed light beam by a wavelength offset from a baseline wavelength for each step in the pattern period; measuring the wavelength of the light beam for each step in the pattern period as the wavelength is modified across the pattern; and estimating a spectral feature of the pulsed light beam over an evaluation window that includes all of the steps within the pattern period based at least in part on the measured wavelength of the light beam for each step in the pattern period.

Implementations can include one or more of the following features. For example, the method can also include measuring an unshifted baseline spectral shape of the light beam output from the optical source when the wavelength of the light beam is the baseline wavelength. The spectral feature can be estimated by using, at least in part, the measured unshifted baseline spectral shape. The method can include applying a waveform to the unshifted baseline spectral shape of the light beam based on the measured wavelength of the light beam to produce a shifted spectral shape; determining an energy of the light beam at the output of the optical source; and scaling the shifted spectral shape according to the determined energy to produce a scaled spectral shape.

The spectral feature can be estimated by analyzing the produced scaled spectral shape to estimate a bandwidth of the pulsed light beam over the evaluation window. The produced scaled spectral shape can be analyzed to estimate the bandwidth of the pulsed light beam over the evaluation window by determining a width of the produced scaled spectral shape over the evaluation window.

The produced scaled spectral shape can be analyzed to estimate the bandwidth of the pulsed light beam over the evaluation window by convolving a distribution with the produced scaled spectral shape to form a convolved spectral shape, and measuring a width of the convolved spectral shape at a particular height of the shape.

The waveform can be applied to the unshifted baseline spectral shape by shifting the baseline spectral shape by an amount that is based on the waveform.

The method can include, for each wavelength step in the evaluation window, estimating an area under the scaled spectral shape.

The spectral feature of the pulsed light beam can be estimated based on the measured unshifted baseline spectral shape by measuring a bandwidth of the measured unshifted baseline spectral shape using one or more metrics. The spectral feature of the pulsed light beam can be estimated based on the measured wavelength of the light beam for each pulse in the pattern period by determining a standard deviation of the measured wavelength of the light beam at each pulse.

The spectral feature of the pulsed light beam can be estimated by estimating the spectral feature of the pulsed light beam without estimating a spectral shape of the pulsed light beam over the evaluation window that includes all of the wavelength steps within the pattern period.

The spectral feature of the pulsed light beam can be estimated based on the measured wavelength of the light beam for each pulse in the pattern period by determining a standard deviation of the measured wavelength of the light beam at each pulse. And, the method can also include, based on the determined standard deviation, estimating the spectral feature by calculating the spectral feature using an experimentally predetermined functional relationship between the spectral feature evaluated across the evaluation window and the standard deviation. The spectral feature can be estimated by calculating the spectral feature using an experimentally predetermined polynomial relationship between an estimated bandwidth of the pulsed light beam measured across the evaluation window and the standard deviation. The experimentally predetermined polynomial relationship between the estimated bandwidth of the pulsed light beam measured across the evaluation window and the standard deviation can be used by estimating the bandwidth for a set of standard deviations, each estimation comprising convolving a distribution with the spectral shape measured across the evaluation window to form a convolved spectral shape, and measuring a width of the convolved spectral shape at a particular height of the shape.

The method can include measuring an unshifted baseline spectral shape of the light beam output from the optical source when the wavelength of the light beam is the baseline wavelength, wherein the experimentally predetermined functional relationship is between the spectral feature evaluated across the evaluation window and both the standard deviation and the measured unshifted baseline spectral shape.

The spectral feature of the pulsed light beam can be estimated over the evaluation window without determining a deconvolution of a spectrum.

The spectral feature of the pulsed light beam over the evaluation window can be estimated without measuring an instantaneous bandwidth of the pulsed light beam.

The method can also include determining whether the estimated spectral feature matches the target spectral feature; and adjusting the predefined repeating pattern to thereby adjust the modification of the wavelength if the estimated spectral feature does not match the target spectral feature.

The method can include determining the adjustment to the predefined repeating pattern based on a set of calibration data. The spectral feature of the pulsed light beam over the evaluation window can be estimated by estimating the spectral feature of the pulsed light beam over the evaluation window that includes all of the steps in a plurality of pattern periods.

The evaluation window can be defined by a number of pulses of the pulsed light beam that provide an illumination dose to a wafer in the path of the pulsed light beam.

Each pattern period step can correlate to one pulse of the light beam.

In other general aspects, a method of estimating a spectral feature of a pulsed light beam produced by an optical source is performed. The method includes measuring a baseline spectral shape of the light beam produced by the optical source; determining a wavelength of the light beam; applying a waveform to the measured baseline spectral shape of the light beam based on the determined wavelength to produce a shifted spectral shape; determining an energy of the light beam at the output of the optical source; scaling the shifted spectral shape according to the determined energy to produce a scaled spectral shape; and analyzing the produced scaled spectral shape to estimate an apparent bandwidth of the pulsed light beam.

Implementations can include one or more of the following features. For example, the produced scaled spectral shape can be analyzed by integrating the scaled spectral shape over an evaluation window to form a prepared spectral shape; and determining a bandwidth of the prepared spectral shape. The bandwidth of the prepared spectral shape can be determined by measuring a width of the prepared spectral shape.

The determined bandwidth of the prepared spectral shape can be the estimated apparent bandwidth of the pulsed light beam.

The bandwidth can be determined by convolving a distribution with the prepared spectral shape to form a convolved spectral shape, and measuring a width of the convolved spectral shape at a particular value.

The waveform can be applied by shifting the measured baseline spectral shape by a wavelength offset that equals the determined wavelength.

The method can also include modifying the wavelength of the light beam for each pulse of the light beam based on a predefined repeating pattern having a pattern period. The wavelength of the light beam can be determined by determining the wavelength of the light beam for each step in the pattern period. The waveform can be applied to the spectral shape of the light beam by shifting the spectral shape by a wavelength for each step in the pattern period. The energy of the light beam can be determined by determining the energy for each step in the pattern period; and by scaling the shifted spectral shape comprises adjusting the spectral shape for each step in the pattern period.

In other general aspects, a method is performed for estimating a spectral feature of a pulsed light beam produced by an optical source. The method includes measuring a baseline spectral shape of the light beam output from the optical source when the light beam is at a baseline wavelength; measuring a set of wavelengths of the light beam that are shifted relative to the baseline wavelength according to a predefined repeating pattern having a pattern period; and estimating an apparent bandwidth of the pulsed light beam based on the measured set of wavelengths and the measured baseline spectral shape across an evaluation window that includes the entire predefined repeating pattern.

Implementations can include one or more of the following features. For example, the method can also include determining a standard deviation of the measured wavelengths of the light beam; and calculating a baseline bandwidth of the measured unshifted baseline spectral shape using one or more metrics. The baseline bandwidth of the measured unshifted baseline spectral shape can be calculated by measuring the bandwidth of the measured unshifted baseline spectral shape using a first metric; and measuring the bandwidth of the measured unshifted baseline spectral shape using a second metric.

The apparent bandwidth can be estimated based on the determined standard deviation of the measured wavelengths and the calculated baseline bandwidth of the measured unshifted baseline spectral shape using one or more metrics.

In other general aspects, an apparatus includes one or more optical elements in the path of a pulsed light beam and configured to optically interact with the pulsed light beam; an actuation system, a measurement system, and a control system. The actuation system is attached to the one or more optical elements and configured to adjust the one or more optical elements to thereby modify the wavelength of the pulsed light beam based on a predefined repeating pattern having a pattern period comprising a plurality of steps, the modification including shifting the wavelength of the pulsed light beam by a wavelength offset from a baseline wavelength for each step in the pattern period. The measurement system is configured to measure a wavelength of the light beam for each step in the pattern period as the wavelength is modified across the pattern. The control system is attached to the actuation system and to the measurement system, and is configured to estimate a spectral feature of the pulsed light beam over an evaluation window that includes all of the steps within the pattern period based at least in part on the measured wavelength of the light beam for each step in the pattern period.

Some benefits result from using spectral shape synthesis. For system performance, predictable and controlled behavior of many optical parameters is improved by a very stable and controlled synthesized spectral shape. Reliability is improved because spectral shape synthesis uses much simpler hardware compared to other methods used to control spectral shape, and previous coupling between bandwidth, energy, divergence, timing, and gas control is removed on the laser side. The system provides for flexibility because of the wide bandwidth tuning range, and fast control of the synthesized bandwidth. There is deployment simplicity because of reduced development, maintenance, and deployment costs due to the fact that only the algorithm and software are modified. There is a cost reduction since there is the potential for a simpler design in a line narrowing module (LNM) and a beam analysis module (BAM) within the optical source. And, currently available hardware modules and technologies can continue to be used; there is no need for additional hardware development. System serviceability, diagnostics, and troubleshooting are improved because diagnostics are simplified due to reduced coupling between laser operational parameters and simplified system hardware and control architecture and gas optimization is simplified.

DESCRIPTION OF DRAWINGS

FIGS. 6A and 6B are graphs of waveform patterns applied to a spectral shape of the light beam of FIG. 1;

FIGS. 6C and 6D are graphs of the resulting synthesized spectral shapes produced by applying the graphs of FIGS. 6A and 6B, respectively, to the light beam of FIG. 1;

FIG. 11A is a flow chart of an exemplary procedure for estimating a spectral feature during the procedure of FIG. 5;

FIG. 11B is a flow chart of an exemplary procedure for analyzing a produced scaled spectral shape during the procedure of FIG. 11A.

DESCRIPTION

Figure 1:
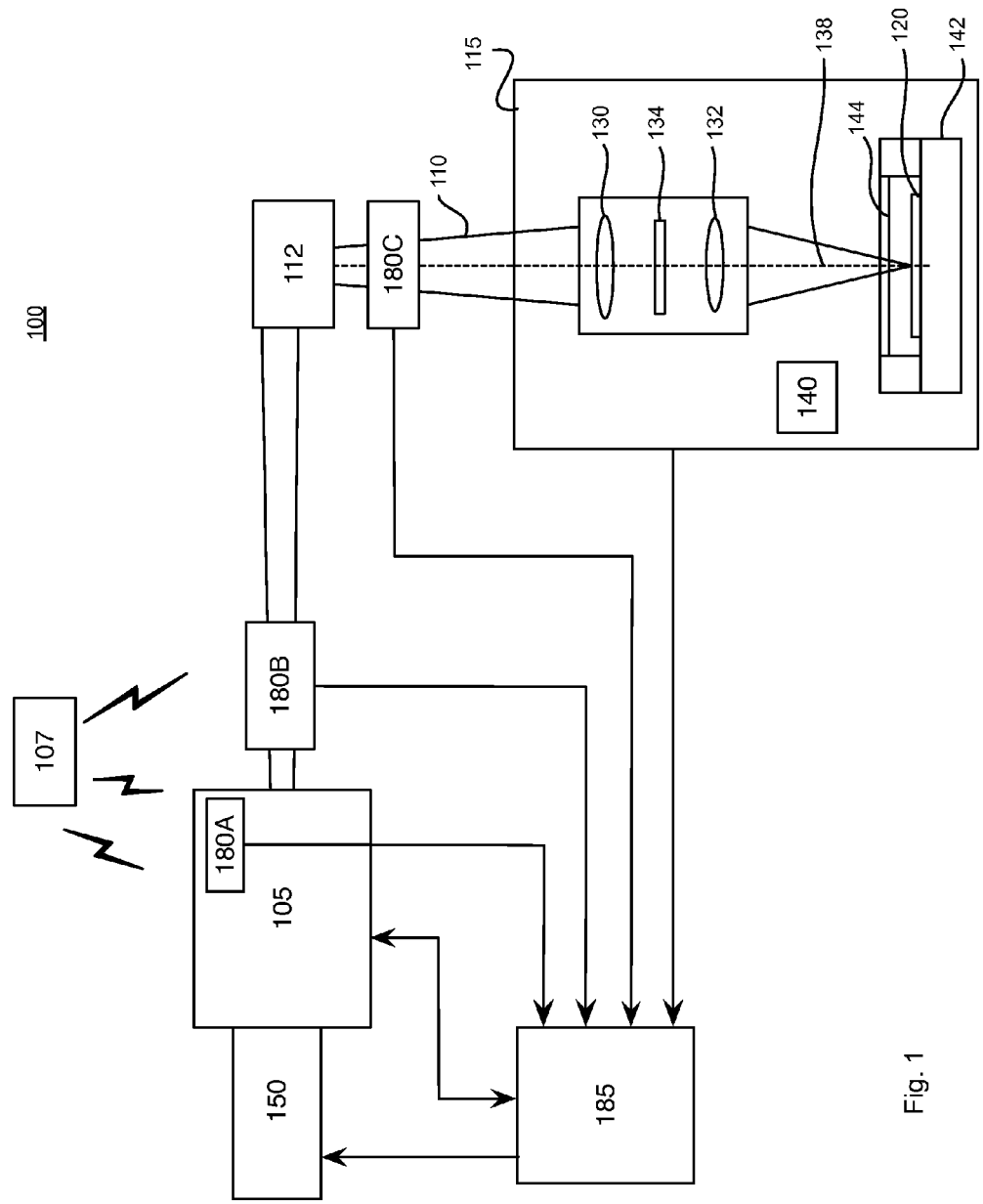
FIG. 1 is a block diagram of a photolithography system including a lithography exposure apparatus.

Referring to FIG. 1, the optical spectrum (or emission spectrum) of a light beam 110 produced by an optical source 105 contains information on how the optical energy or power is distributed over different wavelengths. In FIG. 1, the light beam 110 is a part of a photolithography system 100, and the light beam 110 is therefore directed to a lithography exposure apparatus 115 that creates a pattern on a wafer 120. The light beam 110 is also directed through a beam preparation system 112, which can include optical elements that modify aspects of the light beam 110. For example, the beam preparation system 112 can include reflective or refractive optical elements, optical pulse stretchers, and optical apertures (including auto-shutters).

Usually, the optical spectrum of the light beam 110 is depicted in the form of a diagram where the spectral intensity (not necessarily with an absolute calibration) is plotted as a function of the wavelength or optical frequency. The optical spectrum can be referred to as the spectral shape or intensity spectrum of the light beam. Spectral properties of the light beam 110 include any aspect or representation of the intensity spectrum. For example, the bandwidth is a spectral feature. The bandwidth of the light beam is a measure of the width of this spectral shape, and this width can be given in terms of wavelength or frequency of the laser light. Any suitable mathematical construction (that is, metric) related to the details of the optical source spectrum can be used to estimate the bandwidth of the light beam. For example, the full width of the spectrum at a fraction (X) of the maximum peak intensity of the spectral shape (referred to as FWXM) can be used to estimate the light beam bandwidth. As another example, a width of the spectrum that contains a fraction (Y) of the integrated spectral intensity (referred to as EY) can be used to estimate the light beam bandwidth.

The bandwidth of the light beam 110 can be the actual, instantaneous bandwidth of a spectral shape. However, if the spectral shape of the light beam 110 is synthesized (that is, artificially altered or perturbed) to form a synthesized shape, then the synthesized shape exhibits a bandwidth that can be considered an apparent bandwidth of the light beam, the apparent bandwidth being one that appears to come from a different instantaneous bandwidth. Thus, for example, if the synthesized spectral shape of the light beam exhibits a wider shape than the unperturbed or unsynthesized spectral shape, then the apparent bandwidth may be wider than the instantaneous bandwidth of the light beam.

Various disturbances 107 (such as temperature gradients, pressure gradients, optical distortions, etc.) act on the optical source 105 and the light beam 110 to modify properties and spectral features of the light beam 110. Thus, the lithography system 100 includes other components, such as a spectral feature selection system 150, one or more measurement systems 180 (such as, for example, 180A, 180B, 180C), and a control system 185, that are used to determine the impact of the disturbances on the light beam 110. The spectral feature selection system 150 receives a light beam from the optical source 105 and finely tunes the spectral output of the optical source 105. The one or more measurement systems 180 measure properties such as, for example, bandwidth, wavelength, or energy, of the light beam 110.

Because of these disturbances, the bandwidth of this synthesized shape needs to be measured or estimated so that an operator or an automated system (for example, a feedback controller) can use the information to adjust the properties of the optical source 105 and adjust the spectral shape of the light beam 110, which can change due to the disturbances. A method is described that enables the estimation of the bandwidth of a synthesized spectral shape.

Initially, though, a general discussion of the lithography system 100 is provided with reference to FIG. 1.

The lithography exposure apparatus 115 includes an optical arrangement that includes an illuminator system 130 having one or more condenser lenses, a mask 134, and an objective arrangement 132. The mask 134 is movable in along one or more directions, such as along an optical axis 138 of the light beam 110 or in a plane that is perpendicular to the optical axis 138. The lithography exposure apparatus 115 is contained within a sealed chamber that can be maintained at a constant temperature and pressure to reduce distortions in patterns printed on the wafer 120. Moreover, the lithography apparatus 115 can include, among other features, a lithography controller 140, air conditioning devices, and power supplies for the various electrical components.

The lithography controller 140 controls how layers are printed on the wafer 120. The illuminator system 130 adjusts the range of angles for the light beam 110 impinging on the mask 134. The illuminator system 130 also homogenizes (makes uniform) the intensity distribution of the light beam 110 across the mask 134. The objective arrangement 132 includes a projection lens and enables the image transfer to occur from the mask 134 to the photoresist on the wafer 120.

In some implementations, the wafer 120 is carried on a wafer stage 142 and an immersion medium 144 can be supplied to cover the wafer 120 for immersion lithography. In other implementations, the wafer 120 is not covered by an immersion medium 144. The wafer 120 is irradiated by the light beam 110. During lithography, a plurality of pulses of the light beam 110 illuminate the same area of the wafer 120 to form an illumination dose. And, the number of pulses of the light beam 110 that illuminate the same area can be referred to as an evaluation window.

The microelectronic features can be formed on the wafer 120 by depositing a layer of radiation-sensitive photoresist material on the wafer, then positioning the patterned mask 134 over the photoresist layer, and then exposing the masked photoresist layer to the selected radiation (that is, the light beam 110). The wafer 120 is then exposed to a developer, such as an aqueous base or a solvent. And, the portions of the photoresist layer that are resistant to the developer remain on the wafer 120, and the rest of the photoresist layer is removed by the developer to expose the material of the wafer 120 below.

The wafer 120 is then processed using additional process steps, which can be one or more of a combination of process steps such as etching, deposition, and lithography processes with a different mask 134 to create a pattern of openings (such as grooves, channels, or holes) in the material of the wafer 120 or in materials deposited on the wafer 120. These openings can be filled with insulative, conductive, or semiconductive materials to build layers of the microelectronic features on the wafer 120. The wafer 120 is then singulated to form individual chips, which can be incorporated into a wide variety of electronic products, such as computers and other consumer or industrial electronic devices.

As the size of the microelectronic features formed in the wafer 120 decreases (for example, to reduce the size of the chip that is formed by the wafer 120), the size of the features formed in the photoresist layer must also decrease. One way to decrease the CD is to increase the numerical aperture (NA) of the projection lens in the objective arrangement 132. However, as the NA of the projection lens increases, the projected image of the mask 134 on the wafer 120 loses depth of focus (DOF) at isolated features. DOF is needed to achieve a higher yield of processed wafers since the manufacturing process requires a variation in focus. As a result of the lower DOF, the yield of processed wafers can be unacceptably low.

One approach to addressing the foregoing problem is to use spectral shape synthesis on the light beam 110 so that the light beam 110 appears to have a wider bandwidth spectrum at the wafer 120. Most projection lenses (used in the objective arrangement 132) have chromatic aberration, which produces an imaging error on the wafer 120 if there is a wavelength error of the optical source 105. The most dominant error caused by chromatic aberration is focus error and other errors tend to be much smaller. For example, if the wavelength of the light beam 110 is off of the target wavelength, the image on the wafer 120 will have a significant focal plane error. However, these characteristics can be used for DOF improvement, and this is the basis for the spectral shape synthesis.

In general, spectral shape synthesis relies on temporal de-multiplexing of different spectral components. The wavelength of the light beam 110 is modified using spectral shape synthesis on a pulse-to-pulse basis based on a predefined repeating pattern having a pattern period to produce a synthesized spectrum. In particular, the central wavelength of each pulse of the light beam 110 is shifted or offset from a baseline wavelength in this predefined repeating pattern, and this wavelength shift results in a vertical shift (that is, along the optical axis 138) of the image plane on the photoresist layer of the wafer 120. Since every spot on the wafer 120 is illuminated with many pulses, an aggregate depth of focus is improved. Each laser pulse has a narrow instantaneous bandwidth, however, the central wavelength of each laser pulse is offset from the target or baseline wavelength in a predefined pattern so that the apparent bandwidth taken across the pattern period is larger.

An example of such an approach is described in U.S. Pat. No. 7,088,758, "Relax gas discharge laser lithography light source," issued on Aug. 8, 2006 and in U.S. Pat. No. 7,154,928, "Laser output beam wavefront splitter for bandwidth spectrum control," issued on Dec. 26, 2006, both of which are incorporated herein by reference in their entirety.

Figure 2:
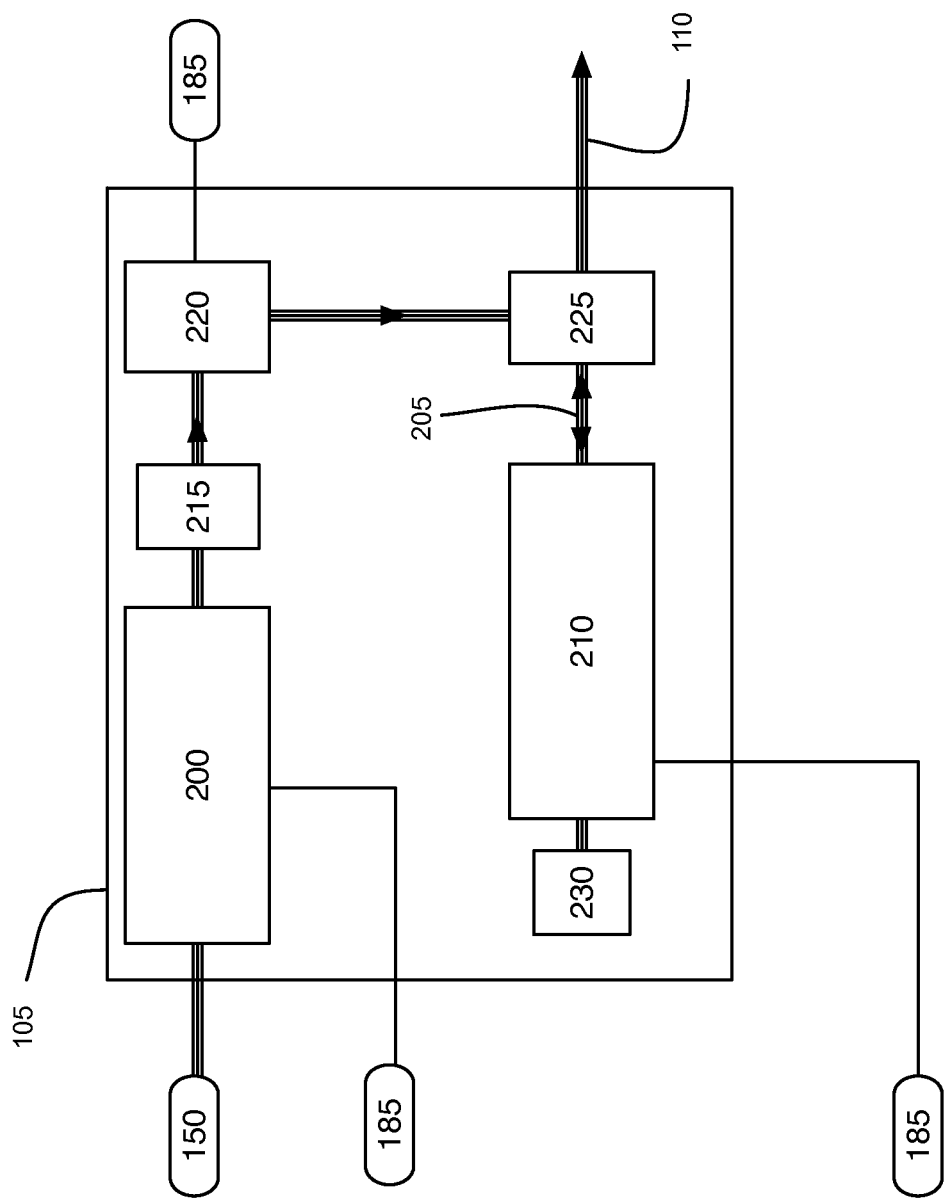
FIG. 2 is a block diagram of an exemplary optical source that produces a light beam directed toward the lithography exposure apparatus of FIG. 1.

More details about the spectral shape synthesis will be discussed below after a description of an exemplary optical source 105 is described with respect to FIG. 2. In FIG. 2, the optical source 105 is a pulsed laser source that produces as the light beam 110 a pulsed laser beam. As shown in the example of FIG. 2, the optical source 105 is a two-stage laser system that includes a master oscillator (MO) 200 that provides a seed light beam 205 to a power amplifier (PA) 210. The master oscillator 200 typically includes a gain medium in which amplification occurs and an optical feedback mechanism such as an optical resonator. The power amplifier 210 typically includes a gain medium in which amplification occurs when pumped with the seed laser beam from the master oscillator. If the power amplifier is designed as a regenerative ring resonator then it is described as a power ring amplifier (PRA) and in this case, enough optical feedback can be provided from the ring design. The master oscillator 200 enables fine tuning of parameters such as the center wavelength and the bandwidth at relatively low output pulse energies. The power amplifier 210 receives the output from the master oscillator 200 and amplifies this output to attain the necessary powers for output to use in photolithography.

The master oscillator 200 includes a discharge chamber having two elongated electrodes, a laser gas that serves as the gain medium, and a fan for circulating the gas between the electrodes, and a laser resonator is formed between the spectral feature selection system 150 on one side of the discharge chamber and an output coupler 215 on a second side of the discharge chamber. The optical source 105 can also include a line center analysis module (LAM) 220 that receives an output from the output coupler 215, and one or more beam modification optical systems 225 that modify the size and/or shape of the laser beam as needed. The line center analysis module (or LAM) 220 is an example of one type of measurement system 180A that can be used to measure the wavelength of the seed light beam 205. The laser gas used in the discharge chamber can be any suitable gas for producing a laser beam around the required wavelengths and bandwidth, for example, the laser gas can be argon fluoride (ArF), which emits light at a wavelength of about 193 nm, or krypton fluoride (KrF), which emits light at a wavelength of about 248 nm.

The power amplifier 210 includes a power amplifier discharge chamber, and if it is a regenerative ring amplifier, the power amplifier also includes a beam reflector 230 that reflects the light beam back into the discharge chamber to form a circulating path. The power amplifier discharge chamber includes a pair of elongated electrodes, a laser gas that serves as the gain medium, and a fan for circulating the gas between the electrodes. The seed light beam 205 is amplified by repeatedly passing through the power amplifier. The beam modification optical system 225 provides a way (for example, a partially-reflecting mirror) to in-couple the seed light beam and to out-couple a portion of the amplified radiation from the power amplifier to form the output light beam 110.

Spectral properties of a light beam output from an optical source include any aspect or representation of an intensity spectrum of the light beam. For example, the bandwidth (or linewidth, which is an estimate of a width of the intensity spectrum) of the light beam is a spectral feature.

In general, the control system 185 receives information about the light beam 110 from the optical source 105 and the measurement systems 180A, 180B, 180C, and information about optical imaging conditions from the lithography exposure apparatus 115 or a user or controller at the apparatus 115, and performs an analysis on the information to determine how to adjust one or more spectral properties (for example, the bandwidth) of the light beam 110 supplied to the lithography exposure apparatus 115. Based on this determination, the control system 185 sends signals to the spectral feature selection system 150 to control operation of the optical source 105. More details about the control system 185 are provided below after a discussion regarding the type and design of the measurement systems 180A, 180B, 180C and the spectral feature selection system 150.

Figure 3A:
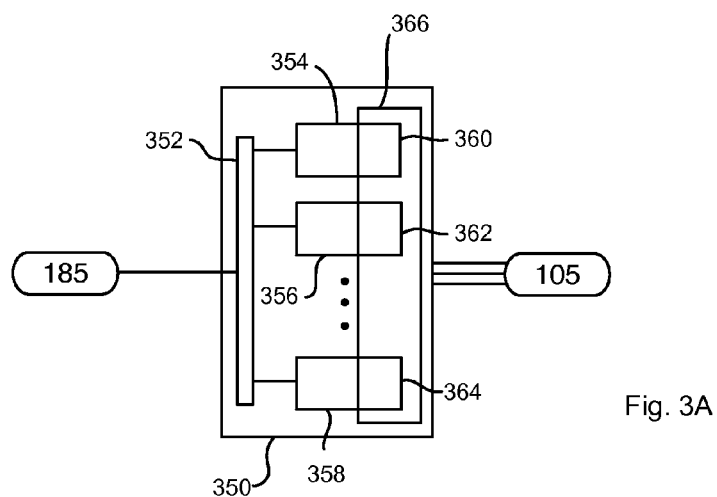
FIG. 3A is a block diagram of an exemplary spectral feature selection system.

Referring to FIG. 3A, an exemplary spectral feature selection system 350 is shown that couples to light from the optical source 105. In some implementations, the spectral feature selection system 150 receives the light from the master oscillator 200 to enable the fine tuning of the parameters such as wavelength and bandwidth within the master oscillator 200.

The spectral feature selection system 350 can include a control module such as spectral feature control module 352 that includes electronics in the form of any combination of firmware and software. The module 352 is connected to one or more actuation systems such as spectral feature actuation systems 354, 356, 358. Each of the actuation systems 354, 356, 358 can include one or more actuators that are connected to respective optical features 360, 362, 364 of an optical system 366. The optical features 360, 362, 364 are configured to adjust particular characteristics of the generated light beam 110 to thereby adjust the spectral feature of the light beam 110. The control module 352 receives a control signal from the control system 185, the control signal including specific commands to operate or control one or more of the actuation systems 354, 356, 358. The actuation systems 354, 356, 358 can be selected and designed to work together, that is, in tandem. Moreover, each of the actuation systems 354, 356, 358 can be optimized to respond to a particular class of disturbances 107. Together such coordination and cooperation can be employed by the control system 185 to hold or maintain the spectral feature (such as the wavelength or bandwidth), at a desired setpoint or at least within a desired range around a setpoint, even though the optical source 105 may be subjected to a wide array disturbances 107. Or, the coordination and cooperation can be employed by the control system 185 to modify the spectral feature (such as the wavelength) to synthesize the spectral shape of the light beam 110 to form a synthesized spectral shape, as discussed below. For example, one or more of the optical features 360, 362, 364 can be modulated to change the wavelength of the light beam 110 output from the optical source 105, such modulation being based on a predefined pattern that repeats every pattern cycle and has a period.

Each optical feature 360, 362, 364 is optically coupled to the light beam 110 produced by the optical source 105. In some implementations, the optical system 366 is a line narrowing module such as that shown in FIG. 3B. The line narrowing module includes as the optical features 360, 362, 364 dispersive optical elements such as reflective gratings 380 and refractive optical elements such as prisms 382, 384, 386, 388, one or more of which can be rotatable. An example of this line narrowing module can be found in U.S. application Ser. No. 12/605,306, entitled "System Method and Apparatus for Selecting and Controlling Light Source Bandwidth," and filed on Oct. 23, 2009 (the '306 application), which is incorporated herein by reference in its entirety. In the '306 application, a line narrowing module is described that includes a beam expander (including the one or more prisms 382, 384, 386, 388) and the dispersive element such as the grating 380. The respective actuation systems for the actuatable optical features such as the grating 380, and one or more of the prisms 382, 384, 386, 388 are not shown in FIG. 3B.

Each of the actuators of the actuation systems 354, 356, 358 is a mechanical device for moving or controlling the respective optical features 360, 362, 364 of the optical system. The actuators receive energy from the module 352, and convert that energy into some kind of motion imparted to the optical features 360, 362, 364 of the optical system. For example, in the '306 application, actuation systems are described such as force devices (to apply forces to regions of the grating) and rotation stages for rotating one or more of the prisms of the beam expander. The actuation systems 354, 356, 358 can include, for example, motors such as stepper motors, valves, pressure-controlled devices, piezoelectric devices, linear motors, hydraulic actuators, voice coils, etc.

It is possible that the spectral feature selection system 350 includes only one actuation system coupled to one optical feature of the optical system, while the other optical features of the optical system remain unactuated. For example, in FIG. 3B, the line narrowing module can be set up so that only one of the prisms (such as the prism 382) is actuated by coupling with its actuation system, and the prism 382 can be movable under the control of a piezoelectric device. For example, the prism 382 can be mounted on a stage that is movable under the control of the piezoelectric device, which is controlled by the module 352.

One of the measurement systems 180A can be the line center analysis module (or LAM) 220, which monitors the wavelength of the output of the master oscillator 200. The line center analysis module can be placed at other locations within the optical source 105, or it can be placed at the output of the optical source 105 if the optical source 105 is a single stage source (that lacks a power amplifier).

Another of the measurement systems 180B is placed at the output of the optical source 105, and this measurement system 180B is used to produce a baseline spectrum of the light beam 110. Thus, the measurement system 180B can be a grating spectrometer such as the ELIAS echelle spectrometer produced by LTB Lasertechnik Berlin GmbH, of Berlin, Germany. In the grating spectrometer, the light beam 110 is directed toward an echelle grating, which separates or disperses the light according to its wavelength, and the light beam 110 reflected from the grating is directed to a camera such as a charge coupled device camera, which is able to resolve the wavelength distribution of the light beam 110. The measurement system 180B can be a part of a bandwidth analysis module (or BAM) when retrofitted into current systems in the field.

The other measurement system 180C can be an energy monitor that measures a pulse energy of the light beam 110 before it enters the lithography exposure apparatus 115. The energy monitor 180C can be a photo-diode module.

Figure 4A:
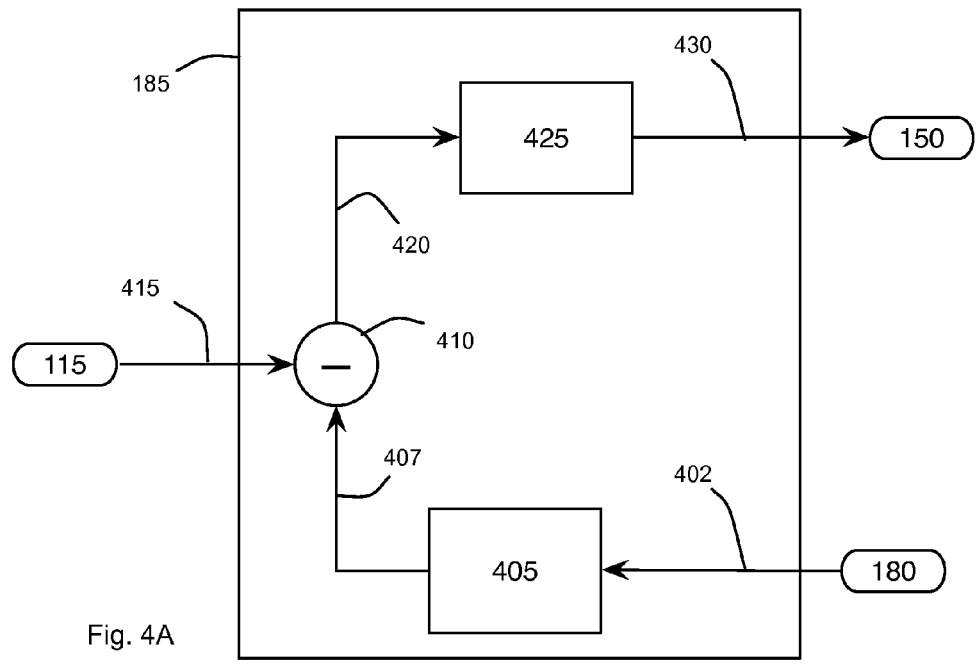
FIG. 4A is a block diagram of an exemplary control system within the photolithography system of FIG. 1.
Figure 4B:
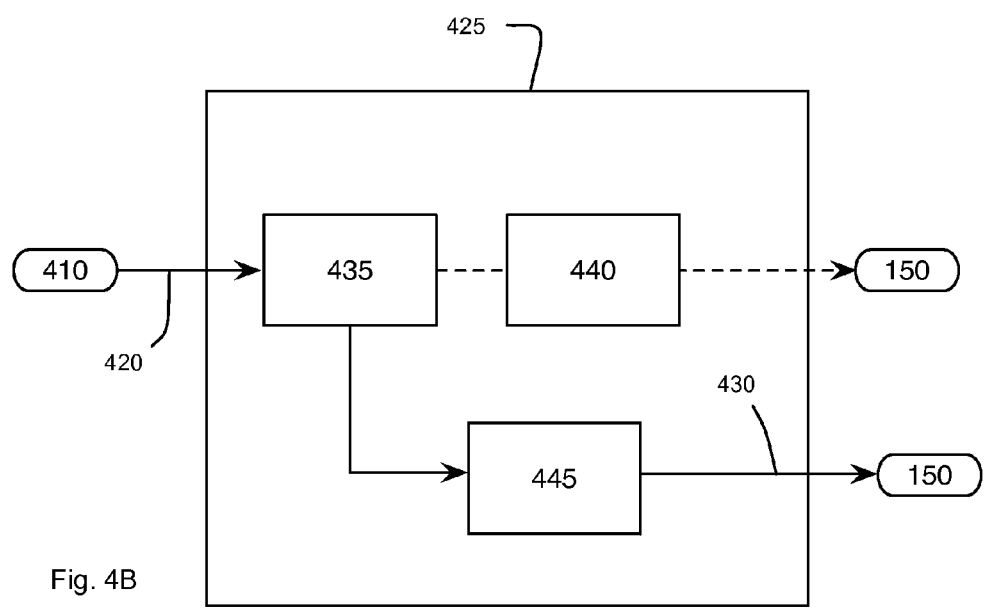
FIG. 4B is a block diagram of an exemplary spectral feature actuation apparatus that is used in the control system of FIG. 4A.

Referring to FIGS. 4A and 4B, details about the control system 185 are provided. The control system 185 generally can include one or more of digital electronic circuitry, computer hardware, firmware, and software. The control system 185 can also include appropriate input and output devices, a computer processor, and a computer program product tangibly embodied in a machine-readable storage device for execution by a programmable processor. Depicted in FIGS. 4A and 4B are the control blocks that represent the various programs or computing blocks present in the control system 185.

The control system 185 includes a spectral feature performance estimator 405 that receives the measurement data 402 from the one or more measurements systems 180A, 180B, 180C. In general, the spectral feature performance estimator 405 performs all of the calculations needed to estimate the spectral feature (for example, the bandwidth) of the synthesized spectral shape. In this case, the spectral feature estimated is an apparent bandwidth of the synthesized spectral shape, but not the instantaneous bandwidth of the unsynthesized spectral shape. The output of the spectral feature performance estimator 405 is an estimated value 407 of the spectral feature.

The control system 185 includes a comparison block 410 connected to the estimated value 407 output from the spectral feature performance estimator 405 and to a spectral feature target value 415 that is received from the lithography exposure apparatus 115 or a user at the lithography exposure apparatus 115. In general, the comparison block 410 outputs a spectral feature error value 420 that represents a difference between the spectral feature target value 415 and the estimated value 407, and the spectral feature error value 420 is directed to a spectral feature actuation apparatus 425. In general, the spectral feature actuation apparatus 425 determines how to adjust the spectral feature selection system 150 based on the spectral feature error value 420, and the output of the spectral feature actuation apparatus 425 includes a set of actuator commands 430 that are sent to the spectral feature selection system 150.

The spectral feature actuation apparatus 425 can include an estimator 435 that stores or accesses calibration data for the various actuators that are within the spectral feature selection system 150. For example, calibration data for a bandwidth control device, a piezoelectric device, or a differential timing system can be stored and/or accessed by the estimator 435. The estimator receives the spectral feature error value 420 and determines one or more of the actuator commands 430.

The spectral feature actuation apparatus 425 includes one or more spectral feature controllers 440, 445 that receive the one or more actuator commands 430 and determine how the actuator commands can be applied to the various actuators of the spectral feature selection system 150. For example, the controller 445 can be a wavelength controller 445 that determines how to adjust the wavelength of the light beam, and thus, how to actuate the piezoelectric device associated with the prism 382 in the spectral feature selection system 350 shown in FIGS. 3A and 3B, as discussed below.

Figure 5:
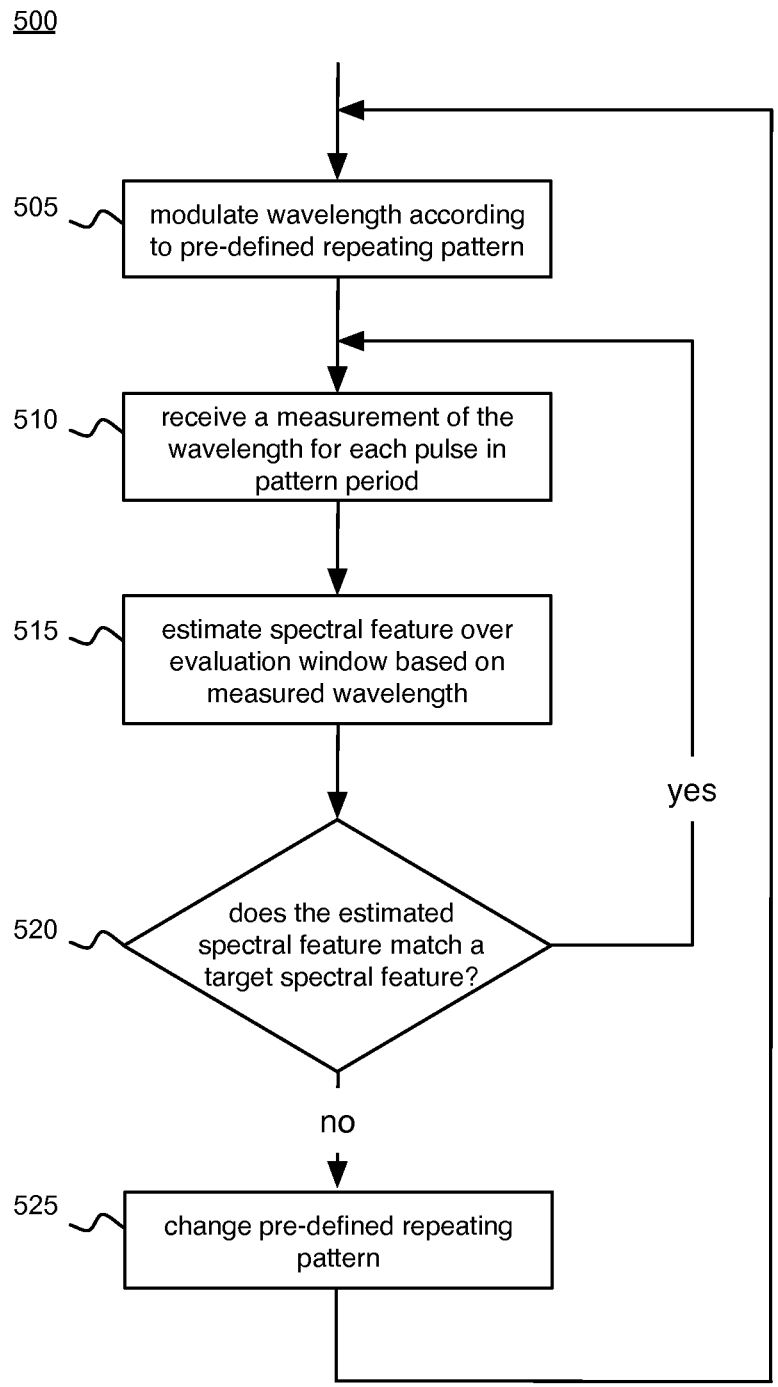
FIG. 5 is a flow chart of a procedure performed by the photolithography system of FIG. 1.

Referring to FIG. 5, a procedure 500 is performed by the control system 185 to estimate an apparent spectral feature (such as an apparent bandwidth ABW) of a pulsed light beam that has been synthesized, that is, artificially altered or perturbed. Thus, the procedure 500 includes synthesizing the pulsed light beam (505) by modulating a wavelength of the pulsed light beam according to a predefined repeating pattern having a plurality of steps in a pattern period. The pattern can be a delta function in the frequency domain, which corresponds to a sine modulation in the time domain. In particular, the control system 185 sends the actuator commands 430 to the spectral feature selection system 150 to thereby synthesize the pulsed light beam (505). For example, the control system 185 can be configured to send actuator commands to a control module 352 of the line narrowing module of FIG. 3B to thereby dither or rotate the prism 382 so that the angle of incidence of the light onto the grating 380 is modulated to select a distinct center wavelength for the light beam 110 output from the optical source 105 and such modulation depends on the predefined repeating pattern.

Examples of suitable sine modulation patterns 600, 650 are shown in FIGS. 6A and 6B. In FIG. 6A, the pattern 600 includes six steps, and the dither phase offset (a value that reflects the relative placement of the pattern over the light beam spectrum) is zero. The pattern 600 produces a corresponding three peak spectral shape 610 of the light beam as shown in FIG. 6C. As shown, the wavelength is offset from a baseline wavelength for each step in the pattern. In FIG. 6B, the pattern 650 includes six steps, and the dither phase offset is non-zero, for example $(27 \times \pi) \div 256$. The pattern 650 produces a corresponding generally six peak spectral shape 660 of the light beam as shown in FIG. 6D. As shown, the synthesized spectral shape 610, 660 is determined by the distribution of wavelength steps within a single pattern period of the wavelength waveform (this is the phase offset). This distribution is defined by the phase offset between the sine wave and the sampling function. It is preserved as the pulse repetition rate (sampling period) changes.

Figure 7A:
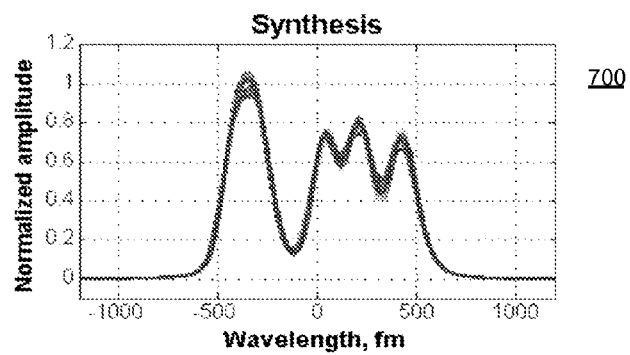
FIGS. 7A-7C are graphs of exemplary synthesized spectral shapes of the light beam of FIG. 1.
Figure 7B:
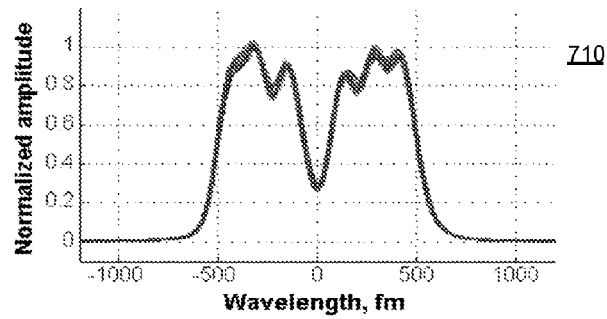
Figure 7C:
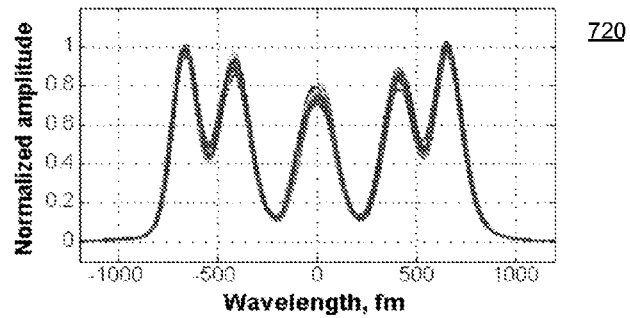

Other examples of spectral shapes 700, 710, 720 are shown, respectively, in FIGS. 7A, 7B, and 7C for modulation patterns having 5, 6, and 10 steps in a pattern period.

The number of steps in the pattern period of the predefined repeating pattern can correlate to the pulse repetition rate of the optical source 105. Thus, each step in the predefined repeating pattern can match up with a single pulse of the light beam 110. In some implementations, the highest possible wavelength modulation rate (smallest pattern period) is used to ensure that reticle images at different wavelengths are well averaged out. The highest modulation rate can be equal to ½ of the laser pulse repetition rate, or about two light beam pulses per pattern period. A practical wavelength modulation rate can be limited by actuator mechanics (for example, the PZT stage associated with the prism 382, the drive circuitry for the PZT drive, and a wavelength control algorithm).

The spectral shape produced by the modulation pattern can be symmetric or asymmetric, and the number of steps in a pattern period can determine the symmetry of the spectral shape. For example, a modulation pattern with an even number of steps per pattern period can yield symmetric spectral shapes, while other pattern periods can yield symmetric or asymmetric spectral shapes. Also, as shown above, the phase offset also determines the output spectral shape. The phase offset can be tuned such that sine modulation with an arbitrary frequency results in a symmetric spectral shape.

Figure 8:
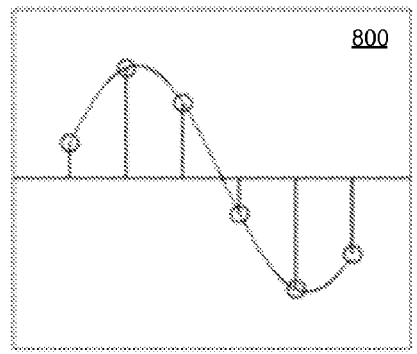
FIG. 8 is a graph of an exemplary waveform of a center wavelength measurement received from a measurement system of the photolithography system of FIG. 1.

Referring again to FIG. 5, the control system 185 receives measurement data 402 of the center wavelength of the light beam 110 for each step in the pattern period as the wavelength is modified across the pattern (510). The control system 185 receives the measurement data 402 of the center wavelength of the light beam 110 from any one of the measurement systems 180. For example, the control system 185 can receive the measurement of the center wavelength from the line center analysis module (or LAM) 220, which monitors the wavelength of the output of the master oscillator 200. An exemplary waveform 800 of the center wavelength measurement from the LAM 220 is shown in FIG. 8.

Next, the control system 185, through operation of the spectral feature performance estimator 405 estimates the spectral feature of the pulsed light beam 110 over an evaluation window that includes all of the steps within the pattern period based at least in part on the measured wavelength of the light beam (as received at 510) for each step in the pattern period (515). The estimated spectral feature can be the apparent bandwidth of the synthesized light beam 110. In this way, the control system 185 is estimating the apparent bandwidth of the synthesized light beam 110, the apparent bandwidth being distinct from the instantaneous bandwidth of the light beam 110 because of the fact that the wavelength of the light beam 110 is being modulated (505).

The control system 185 determines whether the estimated spectral feature 407 matches a target spectral feature 415 (520). The estimated spectral feature 407 may not match the target spectral feature 415 due to various disturbances 107

(such as temperature gradients, pressure gradients, optical distortions, etc.) that act on the optical source 105 and the light beam 110.

In particular, the comparison block 410 determines a spectral feature error 420 between the estimated spectral feature 407 and the target spectral feature 415. If the spectral feature actuation apparatus 425 determines that the spectral feature error 420 is outside of an acceptable range of values, then the control system 185 (through operation of the spectral feature actuation apparatus 425) determines how to adjust the predefined repeating pattern and outputs an adjusted set of actuator commands 430 to the spectral feature selection system 150 (525). The spectral feature actuation apparatus 425 can determine how to adjust the predefined repeating pattern based on a set of calibration data. The calibration data can be determined in a procedure offline that tests how the wavelength of the light beam is modified as adjustments are made to the spectral feature selection system 150 and this data is stored as calibration data accessible to the spectral feature actuation apparatus 425.

Figure 3B:
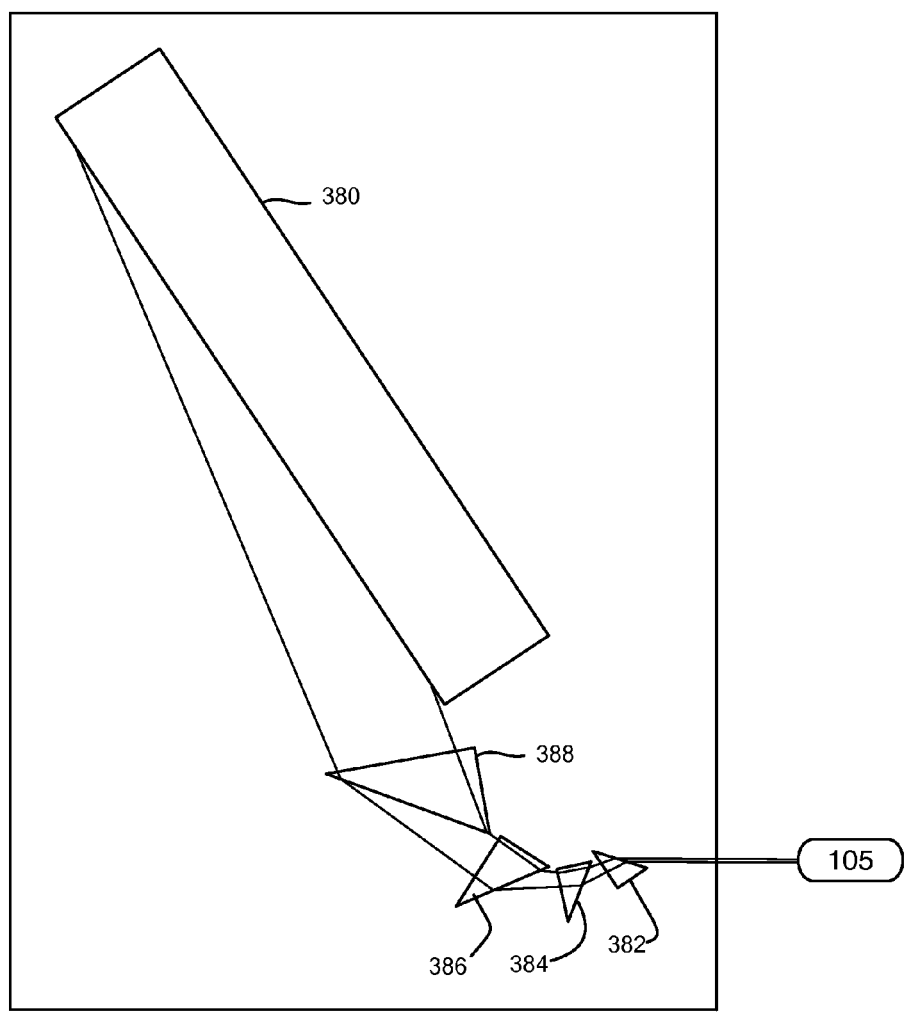
FIG. 3B is a block diagram of exemplary optical components of the spectral feature selection system of FIG. 3A.

If the spectral feature actuation apparatus 425 determines that the spectral feature error 420 is within the acceptable range of values (520), then the control system 185 maintains the current set of actuator commands that are sent to the line narrowing module of FIG. 3B to modulate the wavelength for the light beam 110 (505).

There are several different methods in which the control system 185 can estimate the spectral feature at 515. These different methods are described next.

Figure 9A:
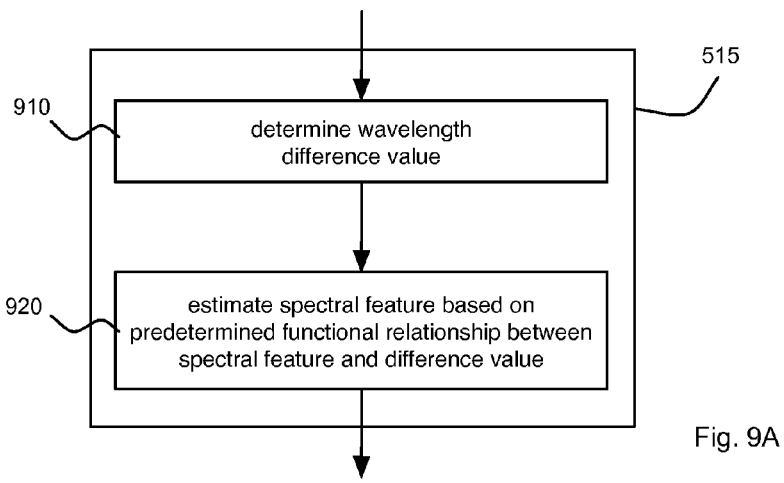
FIG. 9A is a flow chart of an exemplary procedure for estimating a spectral feature during the procedure of FIG. 5.
Figure 9B:
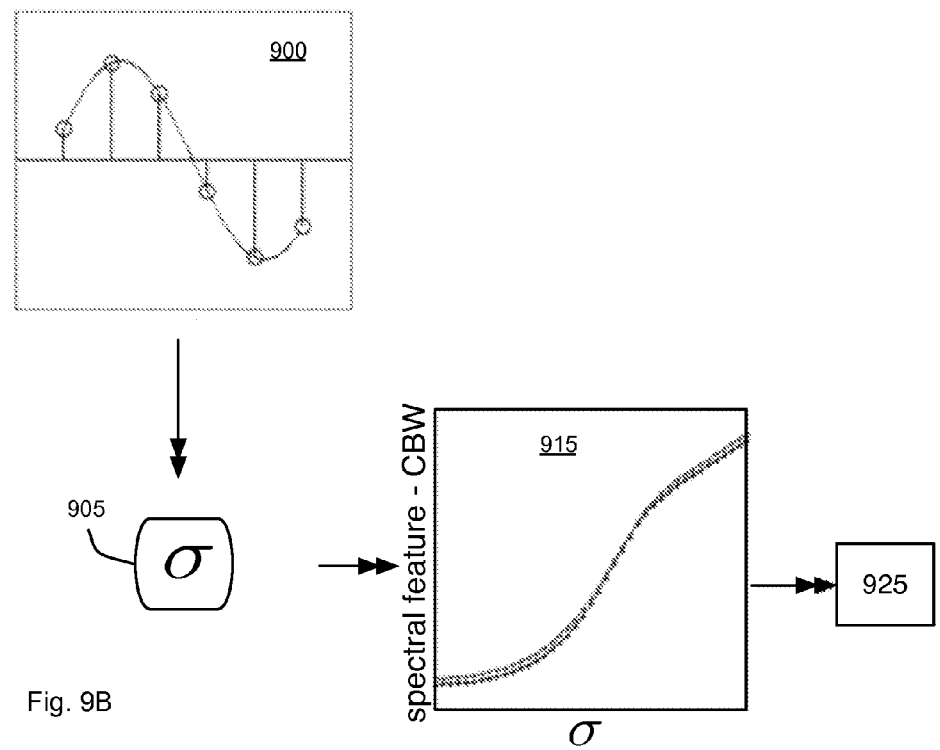
FIG. 9B is a block diagram showing the implementation of the exemplary procedure of FIG. 9A.

Referring to FIGS. 9A and 9B, in some implementations, the control system 185 estimates the spectral feature 925 at 515 by determining a wavelength difference value 905 (such as a standard deviation) between the measured wavelength of the light beam at each pulse and the baseline wavelength (910). The wavelength difference value 905 is determined from the values of the center wavelength 900 received from the LAM 220. Next, the control system 185 estimates the spectral feature 925 using a predetermined functional relationship 915 between the spectral feature evaluated across the evaluation window and the determined wavelength difference value 905 (920).

The predetermined functional relationship 915 can be a polynomial relationship between the estimated apparent bandwidth (ABW) of the pulsed light beam measured across the evaluation window and the standard deviation σ (WL). For example, the functional relationship 915 can be determined empirically to best approximate an $8^{th}$ order polynomial of the standard deviation, as follows:

$$ABW = p0 + p1 \times [\sigma(WL)] + p2 \times [\sigma(WL)]^2 + p3 \times [\sigma(WL)]^3 + p4 \times [\sigma(WL)]^4 + p5 \times [\sigma(WL)]^5 + p6 \times [\sigma(WL)]^6 + p7 \times [\sigma(WL)]^7,$$

in which p0, p1, p2, p3, p4, p5, p6, and p7 are coefficients that are fixed if the solution is developed with a fixed spectral shape, and the ABW of the light beam is determined as a convolved bandwidth of the laser spectral shape, synthesized by wavelength modulation. The coefficients can have a dependence on the spectral shape, as determined by the amplitude by the dither, and the correction for the spectral shape dependence can be included. In order to develop the functional relationship 915, the ABW is estimated for a set of standard deviations, and each estimation of the ABW includes a convolution of a distribution with the spectral shape measured across the evaluation window to form a convolved spectral shape, and then the width of the convolved spectral shape at a particular value of the shape is measured. In some implementations, the polynomial detailed above can provide an accuracy to within 25 femtometers (fm) of the actual apparent bandwidth measured with the convolution if the bandwidth is in the range of 0-2000 fm.

Figure 10A:
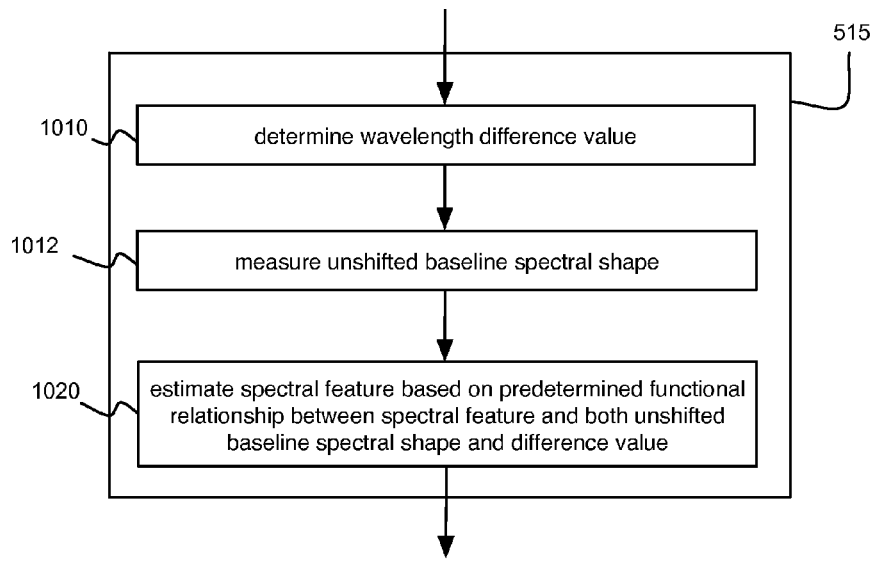
FIG. 10A is a flow chart of an exemplary procedure for estimating a spectral feature during the procedure of FIG. 5.
Figure 10B:
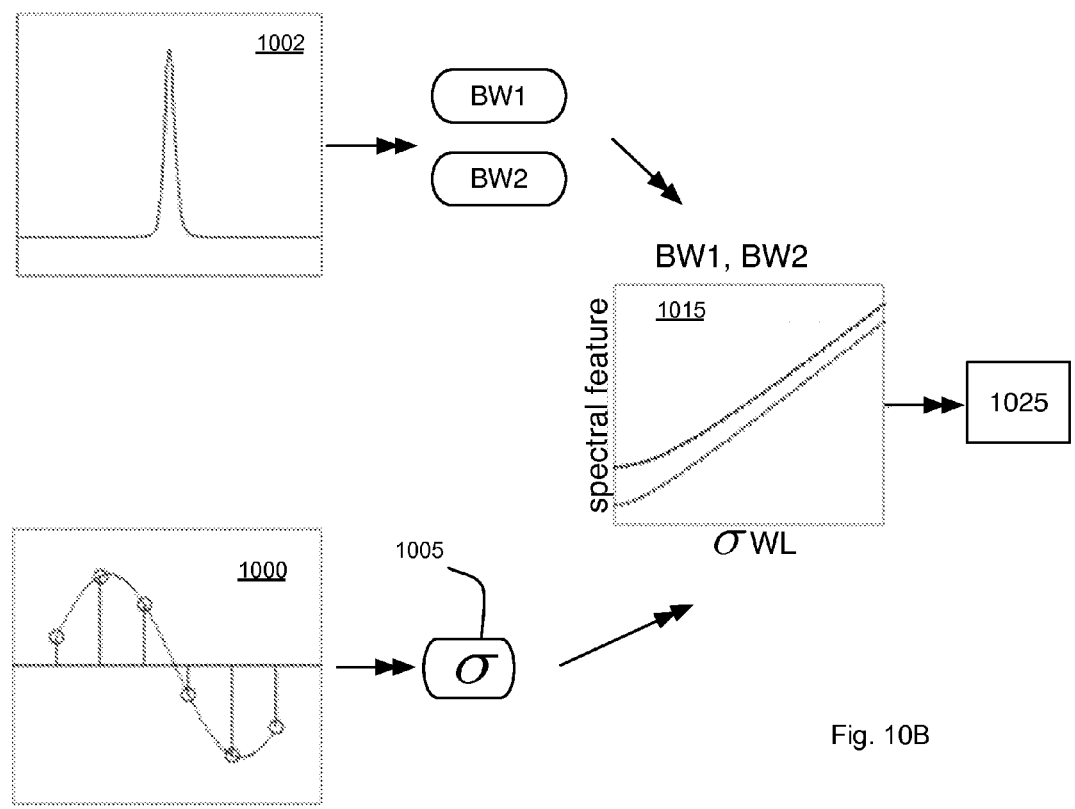
FIG. 10B is a block diagram showing the implementation of the exemplary procedure of FIG. 10A.

Referring to FIGS. 10A and 10B, in other implementations, the control system 185 estimates the spectral feature 1025 at step 515 by determining a wavelength difference value 1005 (such as a standard deviation) between the measured wavelength of the light beam at each pulse and the baseline wavelength (1010). The wavelength difference value 1005 is determined from the values of the center wavelength 1000 received from the LAM 220.

The control system 185 also measures an unshifted baseline spectral shape 1002 of the light beam output from the optical source 105 when the wavelength of the light beam 110 is the baseline wavelength (1012). In particular, the control system 185 receives the baseline spectral shape 1002 produced by the grating spectrometer 180B.

Next, the control system 185 estimates the spectral feature 1025 using a predetermined functional relationship 1015 between the spectral feature evaluated across the evaluation window and the determined wavelength difference value 1005 and the measured baseline spectral shape 1002 (1020). In some implementations, the relationship 1015 depends on one or more widths of the baseline spectral shape 1002. For example, the relationship 1015 can depend on a full width BW1 (FWXM) of the baseline spectral shape 1002 taken at a percentage X of the maximum intensity of the spectral shape 1002 and a width BW2 (EY) of the baseline spectral shape 1002 including a percentage Y of the entire spectral energy. These baseline widths BW1, BW2 are of the laser spectral shape with no wavelength modulation applied.

The predetermined functional relationship 1015 can be a functional relationship between the estimated bandwidth (spectral feature) ABW of the pulsed light beam measured across the evaluation window according to a standard metric (such as EY or FWXM, defined above) and the standard deviation σ (WL), and the one or more baseline widths BW1, BW2. For example, the functional relationship 1015 can be determined empirically as follows:

$$ABW = q1 \times [\sigma(WL)] + \{q2 \times BW1 \times [\sigma(WL)]\} / \{BW1 + [\sigma(WL)]\} + \{BW2 \times BW1\} / \{BW1 + [\sigma(WL)]\},$$

in which q1 and q2 are coefficients such as, for example, 2 and 0.5, respectively; ABW in some implementations is the width of the synthesized spectral shape including a percentage Y of the entire spectral energy of the synthesized spectral shape (for example, ABW can be E95).

In other implementations, the estimated bandwidth ABW can be a full width (FWXM) of the synthesized spectral shape taken at a percentage X of the maximum intensity of the spectral shape.

Figure 12:
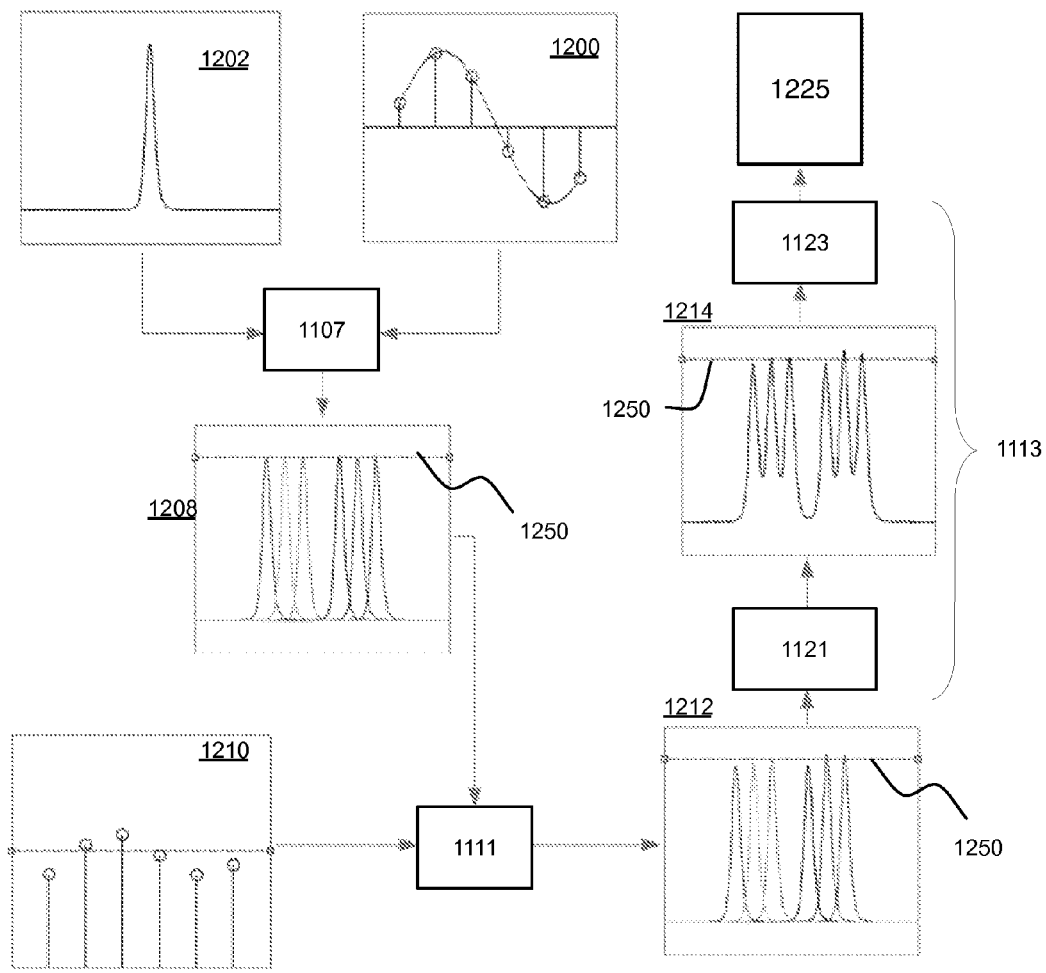
FIG. 12 is a block diagram showing the implementation of the exemplary procedure of FIG. 10A.

Referring to FIGS. 11A and 12, in other implementations, the spectral shape can be evaluated to thereby estimate the spectral feature 1225 of the pulsed light beam 110 over the evaluation window using a procedure 1115. The procedure 1115 can be performed either offline as a separate procedure from the procedure 500 or as a part of step 515, which is described below.

As noted above, prior to step 515, the control system receives the measurement data 402 of the center wavelength of the light beam 110 for each step in the pattern period as the wavelength is modified across the pattern at step 510. The control system 185 receives the measurement data 402 of the center wavelength of the light beam 110 from any one of the measurement systems 180. For example, the control system 185 can receive the measurement of the center wavelength from the line center analysis module (or LAM) 220, which monitors the wavelength of the output of the master oscillator 200. An exemplary waveform 1200 of the center wavelength measurement from the LAM 220 is shown in FIG. 12.

In the procedure 1115, the control system 185 measures an unshifted baseline spectral shape 1202 of the light beam output from the optical source 105 when the wavelength of the light beam 110 is the baseline wavelength (1105). In particular, the control system 185 receives the baseline spectral shape 1202 produced by the grating spectrometer 180B.

The control system 185 applies the waveform 1200 to the unshifted spectral shape 1202 based on the measured wavelength to produce a shifted spectral shape 1208 (1107). The waveform 1200 can be applied by shifting the baseline spectral shape 1202 by an amount that is based on (for example, a factor of) the measured wavelength at east step in the waveform 1200.

Next, the control system 185 receives a determination or measurement of an energy 1210 of the light beam 110 at the output of the optical source 105 (1109). In particular, the energy 1210 can be determined for each step in the pattern period by a measurement system 180 such as the energy monitor 180C. The control system 185 scales the shifted spectral shape 1208 according to the determined energy 1210 to produce a scaled spectral shape 1212 (1111). The produced scaled spectral shape 1212 is analyzed (1113) to estimate the apparent bandwidth ABW 1225.

Referring to FIG. 11B, the produced scaled spectral shape 1212 can be analyzed at 1113 by first integrating the scaled spectral shape 1212 over an evaluation window 1250 to form a prepared spectral shape 1214 (1121) and then determining a bandwidth of the prepared spectral shape 1214 (1123) by, for example, using any suitable metric, such as FWXM or EY or a convolved BW. The scaled spectral shape 1212 is integrated at 1121 by estimating an area under the scaled spectral shape 1212 at each wavelength step in the evaluation window.

During the procedure 1115, it can be assumed that the spectral shape of the light beam 110 is constant.

In summary, the synthesized spectral shape is estimated during procedure 1115 based on an exact spectral shape of laser output, measured with no wavelength modulation; real-time wavelength metrology data; and real-time pulse energy data. Advantages of this technique include great agreement with external metrology; best available estimate of the output spectral shape and metrics for synthesized spectral shapes; reduced complexity of hardware/software interfaces; and pulse-pulse capability.

In summary, bandwidth metric estimation provides a model of output spectral shape metrics ABW, which can be, for example, convolved BW or EY, based on baseline spectrum metrics (such as BW1 or FHWM, and BW2 or E95) and real-time wavelength metrology data ($\sigma$ (WL)). The advantages of this technique are straightforward computation (can be implemented on a laser control processor or a fire control processor); has reduced complexity of hardware/software interfaces; and has real-time pulse-pulse capability.

A typical starting or instantaneous bandwidth range (measured using E95) of the light beam 110 can be about 150-500 fm. The wavelength modulation range can be +/−1500 fm. And, the resulting synthesized spectrum bandwidth E95 range can be about 150-2500 fm. The wavelength steps can be controlled to a precision of about 0.1 fm, and the step size of the wavelength shift can be between about 0 and 500 fm, depending on the application.

In the control system 185, because bandwidth control is implemented using the spectral shape synthesis approach, bandwidth control can be decoupled internally from system efficiency and beam parameters. Bandwidth control could still be coupled through scanner energy control loop.

The procedure embodying the techniques (discussed above) can be performed by a programmable processor executing a program of instructions to perform desired functions by operating on input data and generating appropriate output. Generally, a processor receives instructions and data from a read-only memory and/or a random access memory. Storage devices suitable for tangibly embodying computer program instructions and data include all forms of non-volatile memory, including, by way of example, semiconductor memory devices, such as EPROM, EEPROM, and flash memory devices; magnetic disks such as internal hard disks and removable disks; magneto-optical disks; and CD-ROM disks. Any of the foregoing may be supplemented by, or incorporated in, specially-designed ASICs (application-specific integrated circuits).

What is claimed is:

1. A method of estimating a spectral feature of a pulsed light beam produced by an optical source, the method comprising:
   modifying the wavelength of the pulsed light beam based on a predefined repeating pattern having a pattern period comprising a plurality of steps, the modification including shifting the wavelength of the pulsed light beam by a wavelength offset from a baseline wavelength for each step in the pattern period;
   measuring the wavelength of the light beam for each step in the pattern period as the wavelength is modified across the pattern; and
   estimating a spectral feature of the pulsed light beam over an evaluation window that includes all of the steps within the pattern period based at least in part on the measured wavelength of the light beam for each step in the pattern period including:
   determining a standard deviation of the measured wavelength of the pulsed light beam at each step; and
   based on the determined standard deviation, estimating the spectral feature by calculating the spectral feature using a functional relationship between the spectral feature evaluated across the evaluation window and the standard deviation.

2. The method of claim 1, further comprising measuring an unshifted baseline spectral shape of the light beam output from the optical source when the wavelength of the light beam is the baseline wavelength.

3. The method of claim 2, wherein estimating the spectral feature is also based at least in part on the measured unshifted baseline spectral shape.

4. The method of claim 3, further comprising:
   applying a waveform to the unshifted baseline spectral shape of the light beam based on the measured wavelength of the light beam to produce a shifted spectral shape;
   determining an energy of the light beam at the output of the optical source; and
   scaling the shifted spectral shape according to the determined energy to produce a scaled spectral shape.

5. The method of claim 4, wherein estimating the spectral feature comprises:
   analyzing the produced scaled spectral shape to estimate a bandwidth of the pulsed light beam over the evaluation window.

6. The method of claim 5, wherein analyzing the produced scaled spectral shape to estimate the bandwidth of the pulsed light beam over the evaluation window comprises determining a width of the produced scaled spectral shape over the evaluation window.

7. The method of claim 5, wherein analyzing the produced scaled spectral shape to estimate the bandwidth of the pulsed light beam over the evaluation window comprises:
convolving a distribution with the produced scaled spectral shape to form a convolved spectral shape, and
measuring a width of the convolved spectral shape at a particular height of the shape.

8. The method of claim 4, wherein applying the waveform to the unshifted baseline spectral shape comprises shifting the baseline spectral shape by an amount that is based on the waveform.

9. The method of claim 4, further comprising, for each wavelength step in the evaluation window, estimating an area under the scaled spectral shape.

10. The method of claim 3 wherein estimating the spectral feature of the pulsed light beam based on the measured unshifted baseline spectral shape comprises measuring a bandwidth of the measured unshifted baseline spectral shape using one or more metrics.

11. The method of claim 10, wherein estimating the spectral feature of the pulsed light beam based on the measured wavelength of the light beam for each pulse in the pattern period comprises determining a standard deviation of the measured wavelength of the light beam at each pulse.

12. The method of claim 1, wherein estimating the spectral feature of the pulsed light beam comprises estimating the spectral feature of the pulsed light beam without estimating a spectral shape of the pulsed light beam over the evaluation window that includes all of the wavelength steps within the pattern period.

13. The method of claim 1, wherein
estimating the spectral feature by calculating the spectral feature using the functional relationship between the spectral feature evaluated across the evaluation window and the standard deviation comprises using an experimentally predetermined functional relationship between the spectral feature evaluated across the evaluation window and the standard deviation.

14. The method of claim 13, wherein estimating the spectral feature by calculating the spectral feature using the experimentally predetermining functional relationship between the spectral feature and the standard deviation comprises using an experimentally predetermined polynomial relationship between an estimated bandwidth of the pulsed light beam measured across the evaluation window and the standard deviation.

15. The method of claim 14, wherein using the experimentally predetermined polynomial relationship between the estimated bandwidth of the pulsed light beam measured across the evaluation window and the standard deviation comprises:
estimating the bandwidth for a set of standard deviations, each estimation comprising convolving a distribution with the spectral shape measured across the evaluation window to form a convolved spectral shape, and measuring a width of the convolved spectral shape at a particular height of the shape.

16. The method of claim 13, further comprising measuring an unshifted baseline spectral shape of the light beam output from the optical source when the wavelength of the light beam is the baseline wavelength, wherein the experimentally predetermined functional relationship is between the spectral feature evaluated across the evaluation window and both the standard deviation and the measured unshifted baseline spectral shape.

17. The method of claim 1, wherein estimating the spectral feature of the pulsed light beam over the evaluation window lacks a deconvolution of a spectrum.

18. The method of claim 1, wherein estimating the spectral feature of the pulsed light beam over the evaluation window comprises estimating the spectral feature of the pulsed light beam over the evaluation window without measuring an instantaneous bandwidth of the pulsed light beam.

19. The method of claim 1, further comprising:
determining whether the estimated spectral feature matches the target spectral feature; and
adjusting the predefined repeating pattern to thereby adjust the modification of the wavelength if the estimated spectral feature does not match the target spectral feature.

20. The method of claim 19, further comprising determining the adjustment to the predefined repeating pattern based on a set of calibration data.

21. The method of claim 1, wherein estimating the spectral feature of the pulsed light beam over the evaluation window comprises estimating the spectral feature of the pulsed light beam over the evaluation window that includes all of the steps in a plurality of pattern periods.

22. The method of claim 1, wherein the evaluation window is defined by a number of pulses of the pulsed light beam that provide an illumination dose to a wafer in the path of the pulsed light beam.

23. The method of claim 1, wherein each pattern period step correlates to one pulse of the light beam.

24. A method of estimating a spectral feature of a pulsed light beam produced by an optical source, the method comprising:
modifying the wavelength of the pulsed light beam based on a predefined repeating pattern having a pattern period comprising a plurality of steps, the modification including shifting the wavelength of the pulsed light beam by a wavelength offset from a baseline wavelength for each step in the pattern period;
measuring a baseline spectral shape of the light beam output from the optical source when the light beam is at the baseline wavelength;
measuring a set of wavelengths of the light beam that are shifted relative to the baseline wavelength according to a predefined repeating pattern having a pattern period;
determining a wavelength difference value between the measured wavelength of the light beam at each step in the pattern period and the baseline wavelength; and
estimating an apparent bandwidth of the pulsed light beam based on the measured set of wavelengths, the determined wavelength difference value, and the measured baseline spectral shape across an evaluation window that includes all of the steps within the pattern period of the entire predefined repeating pattern.

25. The method of claim 24, wherein:
determining the wavelength difference value comprises determining a standard deviation of the measured wavelengths of the light beam; and
the method further comprises calculating a baseline bandwidth of the measured unshifted baseline spectral shape using one or more metrics.

26. The method of claim 25, wherein calculating the baseline bandwidth of the measured unshifted baseline spectral shape comprises:
measuring the bandwidth of the measured unshifted baseline spectral shape using a first metric; and
measuring the bandwidth of the measured unshifted baseline spectral shape using a second metric.

27. The method of claim 25, wherein estimating the apparent bandwidth is based on the determined standard deviation of the measured wavelengths and the calculated baseline bandwidth of the measured unshifted baseline spectral shape using one or more metrics.

* * * * *